United States Patent

Holiday

[11] Patent Number: 5,955,683
[45] Date of Patent: Sep. 21, 1999

[54] METHOD AND APPARATUS FOR DETECTING A SOLDER BRIDGE IN A BALL GRID ARRAY

[75] Inventor: Albert Holiday, Langhorne, Pa.

[73] Assignee: Lucent Technologies, Inc., Murray Hill, N.J.

[21] Appl. No.: 09/169,117

[22] Filed: Oct. 8, 1998

[51] Int. Cl.$^6$ ................................................. G01M 19/00
[52] U.S. Cl. ........................................ 73/865.8; 73/865.9
[58] Field of Search ............................... 73/865.8, 865.9; 324/756, 757, 758; 361/748, 771, 736; 29/593

[56] References Cited

U.S. PATENT DOCUMENTS

| | | | |
|---|---|---|---|
| 4,686,637 | 8/1987 | Linker, Jr. et al. | 29/593 |
| 4,704,700 | 11/1987 | Linker et al. | 29/741 |

OTHER PUBLICATIONS

U.S. application No. 09/168,638, Holliday, filed Oct. 8, 1998.

Primary Examiner—Hezron Williams
Assistant Examiner—Thuy Vinh Tran
Attorney, Agent, or Firm—Duane Morris & Heckscher; Steven E. Koffs; William H. Murray

[57] ABSTRACT

An assembled printed circuit board (PCB) is inspected. The PCB has a device assembled to the PCB by a ball grid array (BGA). The BGA includes a plurality of rows of solder connections. A filament is directed into a first side of the BGA, between two adjacent rows of solder connections in the BGA, as far as it will go. A solder bridge is detected if the filament does not emerge from a second side of the BGA opposite the first side. An inspection apparatus for performing this inspection includes a plurality of filaments. Each filament is longer than a side of the BGA. Each filament has a diameter or thickness sufficiently small to fit between adjacent rows of solder connections in the BGA; and a fixture for holding the plurality of filaments. The fixture has a pitch between adjacent filaments approximately equal to a pitch between adjacent rows of solder connections in the BGA. The plurality of filaments are simultaneously directed into respective spaces between successive pairs of rows of solder connections in a first side of the BGA as far as possible into the BGA. A solder bridge is detected if any of the plurality of filaments does not emerge from the second side of the BGA.

14 Claims, 2 Drawing Sheets

METHOD AND APPARATUS FOR DETECTING A SOLDER BRIDGE IN A BALL GRID ARRAY

FIELD OF THE INVENTION

The present invention relates to inspection methods generally, and more specifically to methods for inspecting ball grid array packages.

DESCRIPTION OF THE RELATED ART

The ball grid array (BGA) package is becoming an accepted alternative to conventional surface mount packages. Surface mount packages have a plurality of leads around the perimeter that are connected to respective pads on the printed circuit board (PCB).

BGA packages use the entire bottom surface area of the IC package for contacts, instead of just the perimeter. A rectangular array of evenly spaced contacts is positioned on the bottom surface of the package. A corresponding array of pads is formed on the PCB. A solder ball is formed on each respective contact on the IC package surface. The package is positioned so that the solder balls are aligned with the pads on the PCB. The assembly is heated to re-melt the solder balls and form the electrical connections between the IC package and the circuitry of the PCB.

Once assembled, the solder joints are hidden from view by the IC package. It is possible that a solder bridges may form between two adjacent solder balls during the re-melting step; this solder bridge cannot be detected by visual inspection. In the prior art, X-ray inspection techniques are used to identify solder bridges under the BGA package after assembly. These X-ray systems can be costly (up to about $800,000.00) and cannot be installed in the assembly line because they are very slow. A faster, less expensive inspection system is desired.

SUMMARY OF THE INVENTION

The present invention is a method for inspecting an assembled PCB having a device assembled to the PCB by a ball grid array, in which one or more filaments are inserted in spaces between rows of solder connections, until the filament(s) either emerge from an opposite end of the ball grid array, or are prevented from emerging by an obstruction, indicating the presence of a solder bridge.

According to one aspect of the invention, a method is provided for inspecting an assembled PCB having a device assembled to the PCB by a ball grid array, the ball grid array including a plurality of rows of solder connections. A filament is directed into a first side of the ball grid array, between two adjacent rows of solder connections in the ball grid array. The filament is inserted as far as it will go into the ball grid array. A solder bridge is detected if the filament does not emerge from a second side of the ball grid array opposite the first side.

According to another aspect of the invention, a plurality of filaments are simultaneously directed into respective spaces between successive pairs of rows of solder connections in a first side of the ball grid array. The plurality of filaments are simultaneously inserted as far as possible into the ball grid array. A solder bridge is detected if any of the plurality of filaments does not emerge from the second side of the ball grid array.

According to another aspect of the invention, a filament is directed into the first side of the ball grid array, between two adjacent rows of solder connections in the ball grid array. The filament is inserted into the ball grid array by a distance greater than or equal to the distance between the first and second sides, if the filament is not blocked by an obstruction. A solder bridge is detected if the filament is blocked by an obstruction.

According to yet another aspect of the invention, apparatus is provided for inspecting an assembled PCB having a device assembled to the PCB by a ball grid array, which includes a plurality of rows of solder connections. The apparatus includes a plurality of filaments. Each filament is longer than a side of the ball grid array. Each filament has a diameter or thickness sufficiently small to fit between adjacent rows of solder connections in the ball grid array. A fixture holds the plurality of filaments, with a pitch between adjacent filaments approximately equal to a pitch between adjacent rows of solder connections in the ball grid array.

These and other aspects of the invention are described below with reference to the appended figures and the exemplary embodiments.

DETAILED DESCRIPTION

Figure 1A:
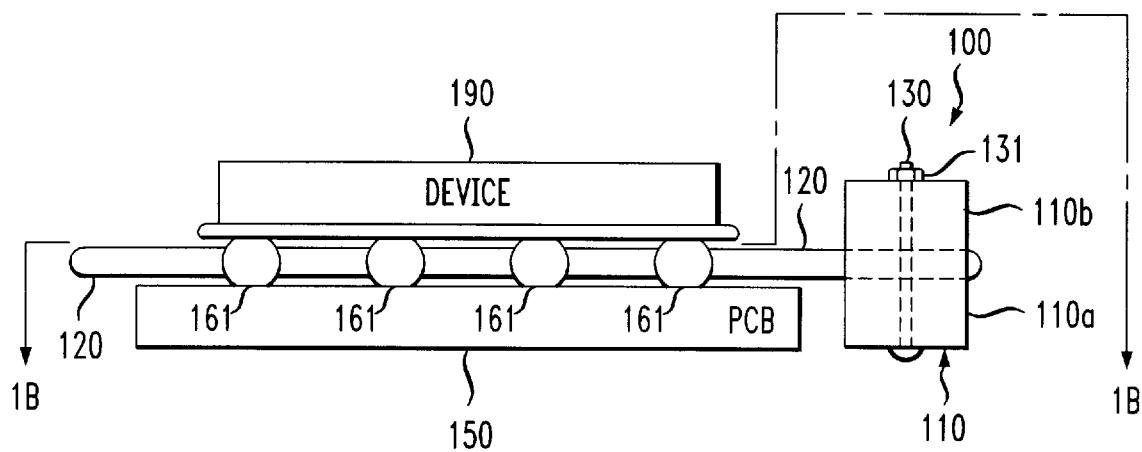
FIG. 1A is a side elevation view of an exemplary method and apparatus for inspecting an assembled PCB according to the invention.
Figure 1B:
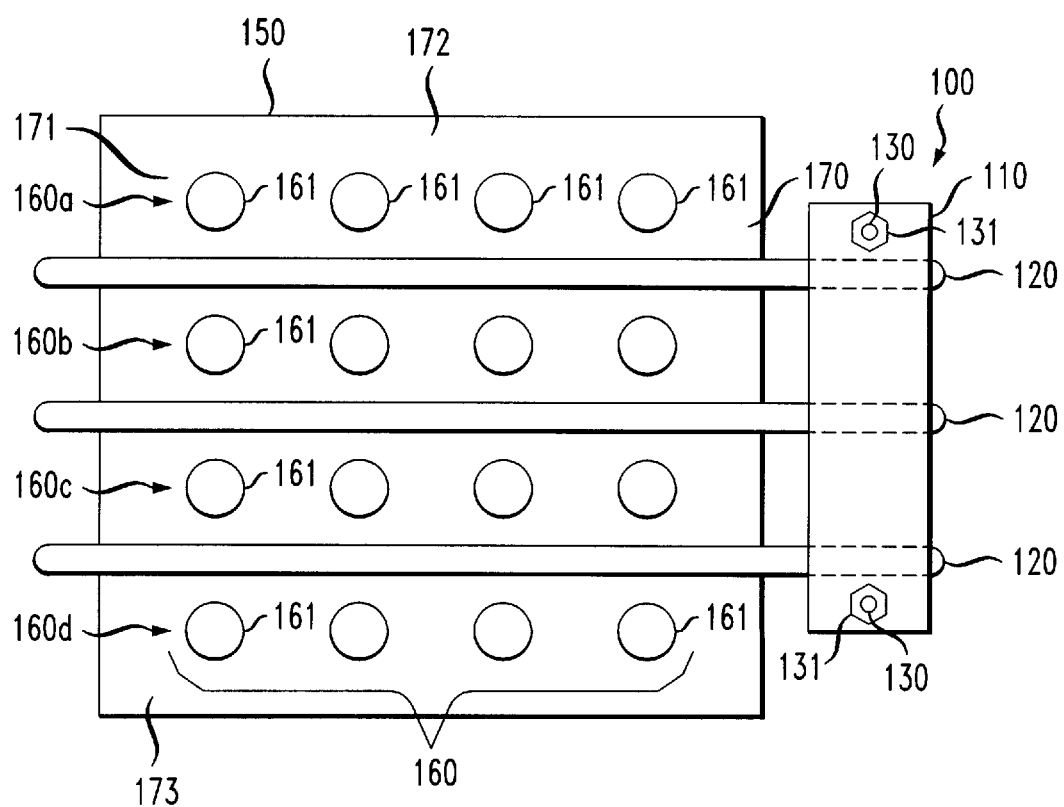
FIG. 1B is a partial cross sectional plan view taken along section line 1B—1B of FIG. 1A.
Figure 2A:
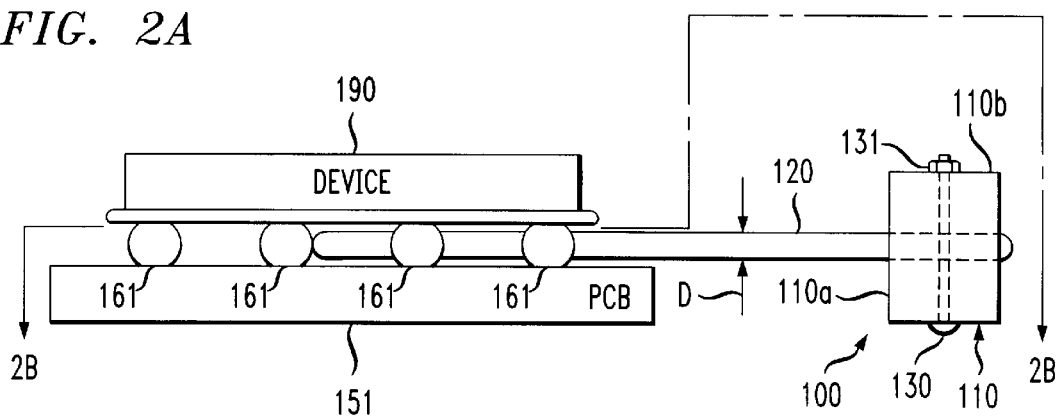
FIG. 2A is a side elevation view of the apparatus of FIG. 1A, detecting a solder bridge beneath the device on a PCB having a defect.
Figure 2B:
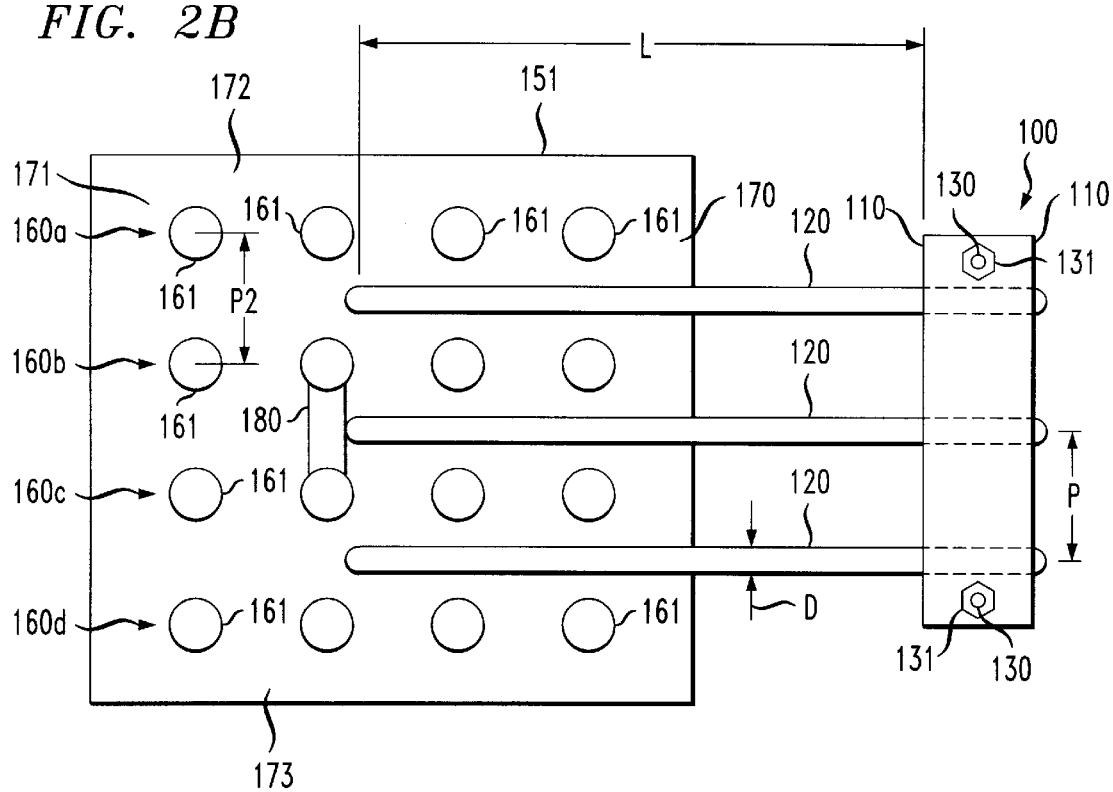
FIG. 2B is a partial cross sectional plan view taken along section line 2B—2B of FIG. 2A.

FIG. 1A is a side elevation view of exemplary apparatus 100 for inspecting an assembled PCB 150 having a device 190 (which may be, for example, an IC chip) assembled to the PCB 150 by a BGA 160 (FIG. 1B). FIG. 1B is a partial cross section of the apparatus 100. FIGS. 2A and 2B show the use of the same apparatus 100 on a different PCB 151 which is defective, due to the presence of a solder bridge 180 between two solder connections 161.

The apparatus 100 of FIG. 1A has a plurality of filaments 120. Each filament 120 is at least as long as, and may be longer than, a side 172 of the BGA 160. Preferably, each of the plurality of filaments has a common length L (shown in FIG. 2B) extending from the fixture. Preferably, each filament is longer than a side of the device 190, so that the end portion of the filament 120 which emerges from the side of the BGA opposite the side into which the filaments 120 are inserted is easily visible. Each filament 120 has a diameter D or thickness sufficiently small to fit between adjacent rows 160a–160d (shown in FIG. 1B) of solder connections 161 in the BGA 160.

For example, the filaments 120 may be formed of a polymer, and may be optical fibers. Exemplary optical fibers may have a diameter D of about 0.2 millimeters (0.008 inches). In the example, the number of filaments 120 is one fewer than the number of rows 160a–160d of solder connections 161 in the BGA 160. Although any number of filaments 120 may be used, if the number of filaments 120 is fewer than the number of rows minus 1, then multiple iterations of the test procedure are needed to inspect every space between rows. If the number of filaments 120 is greater than or equal to the number of rows, then the apparatus 100 is wider than necessary, and may be obstructed by another device (not shown) on the PCB 150 outside of the BGA 160. The number of rows of solder connections 161 typically varies between four and 30, but it is contemplated that larger numbers of rows may also be used.

Figure 3:
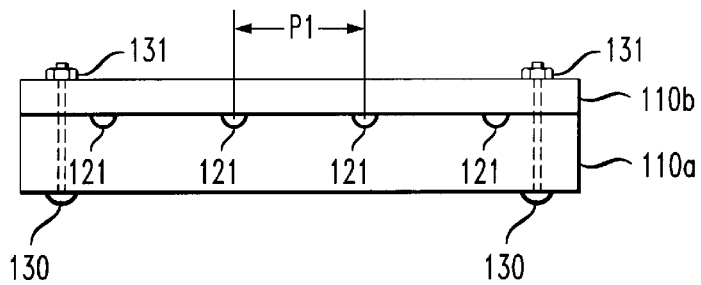
FIG. 3 is an end elevation view of the fixture shown in FIG. 1A.

A fixture 110 holds the plurality of filaments 120. The fixture 110 has a plurality of grooves 121 (shown in FIG. 3) for holding and aligning the filaments 120. The grooves 121 define a pitch P1 (shown in FIGS. 2B and 3) between adjacent filaments 120 approximately equal to a pitch P2 (shown in FIG. 2B) between adjacent rows 160a, 160b of solder connections 161 in the BGA 160.

The exemplary fixture 110 has two pieces: a base 110a and a top 110b. The pieces 110a and 110b of fixture 110 may be formed of any strong, inexpensive material, such as steel, aluminum, or the like. The pieces 110a and 110b may be formed easily, by molding or machining.

Fixture 110 includes a simple fastening means of a conventional type, such as bolts 130 and nuts 131. Any equivalent conventional fastener may be used to hold the two sections of the fixture together with sufficient tightness to fix the filaments 120 within the fixture. Further, although two fasteners 130 are shown, any number of fasteners may be used.

Although the exemplary fixture uses the pressure of the top 110b on the filaments 120 to hold the filaments in place, other known means for gripping the fibers may be used. For example, the surface of grooves 121 may be knurled or have ridges, lands, slots or other non-smooth features to enhance the gripping of the filaments 120. Alternatively, an adhesive may be used to hold the filaments 120 in the grooves 121 of the fixture 100. For example, an epoxy may be used as an adhesive to hold the filaments 120 in place.

One of ordinary skill in the art recognizes that the inspection apparatus 100 may be constructed simply, using very inexpensive materials. This apparatus has a cost which is orders of magnitude less than the cost of an X-ray test apparatus. It's use is simple, requiring virtually no training.

The method for inspecting the assembled PCB 150 having a device 190 assembled to the PCB by a BGA 160 is now described. In one variation of the method, a single filament may be used, with or without a fixture for holding the filament. According to this method, a filament 120 is directed into a first side 170 of the BGA 160, between two adjacent rows 160a, 160b of solder connections 161 in the BGA. The filament is inserted as far as possible into the BGA 160. If the filament 120 emerges from the opposite side of the BGA 160, then no solder bridge is detected. A solder bridge 180 (shown in FIG. 2B) is detected if the filament does not emerge from a second side of the BGA opposite the first side. In other words, the filament is inserted into the BGA by a distance greater than or equal to the distance between the first and second sides, if the filament is not blocked by an obstruction; and a solder bridge is detected if the filament is blocked by an obstruction.

The filament is similarly inserted between the next successive pair of rows of solder connections and the process is repeated, for each pair of rows. Once all of the spaces between rows are inspected, the PCB 150 (or the filament 120) is rotated by 90 degrees (or the filament is moved), and the filament 120 is inserted between two adjacent columns of solder connections in the BGA. This is repeated for each pair of columns in the BGA.

FIGS. 1A and 1B show the use of the inspection apparatus 100 on a PCB which is free of solder bridges. FIGS. 2A and 2B show the same inspection apparatus 100 used to detect a bridge 180 on an otherwise similar PCB 151 which is defective because of the presence of the solder bridge.

Using the apparatus 100 as described above, it is possible to simultaneously direct a plurality of filaments 120 into respective spaces between successive pairs of rows 160a–160d of solder connections 161 in a first side 170 of the BGA. Simultaneously, the plurality of filaments are inserted as far as possible into the BGA. If the plurality of filaments 120 are not blocked, and they emerge from the second side of the BGA 160, no solder bridge is detected. A solder bridge 180 is detected, if any of the plurality of filaments 120 is blocked and does not emerge from the second side of the BGA 160. If the apparatus 100 has a number of filaments greater than or equal to the number of rows of solder connections minus 1, then all of the spaces between successive rows of solder connections may be tested at once.

After all of the spaces between rows of solder connections are inspected, the PCB 150 (or apparatus 100) is rotated 90 degrees, and all of the spaces between adjacent columns of solder connections in the BGA are inspected. Thus, by inserting apparatus 100 into sides 170 and 172 of the BGA 160, it is possible to check for solder bridges in all of the spaces between rows and all of the spaces between columns with only two iterations of the insertion-detection steps: one iteration to inspect between rows, and one iteration to test between columns.

Although the invention has been described in terms of exemplary embodiments, it is not limited thereto. Rather, the appended claim should be construed broadly, to include other variants and embodiments of the invention which may be made by those skilled in the art without departing from the scope and range of equivalents of the invention.

What is claimed is:

1. A method for inspecting an assembled printed circuit board having a device assembled to the printed circuit board by a ball grid array, the ball grid array including a plurality of rows of solder connections, the method comprising the steps of:

directing a filament into a first side of the ball grid array, between two adjacent rows of solder connections in the ball grid array;

inserting the filament as far as possible into the ball grid array; and detecting a solder bridge if the filament does not emerge from a second side of the ball grid array opposite the first side.

2. A method for inspecting an assembled printed circuit board having a device assembled to the printed circuit board by a ball grid array, the ball grid array including a plurality of rows of solder connections, the method comprising the steps of:

(a) simultaneously directing a plurality of filaments into respective spaces between successive pairs of rows of solder connections in a first side of the ball grid array;

(b) simultaneously inserting the plurality of filaments as far as possible into the ball grid array; and (c) detecting a solder bridge if any of the plurality of filaments does not emerge from the second side of the ball grid array.

3. A method according to claim 2, further comprising, before step (a), the step of placing the plurality of filaments in a fixture, with a pitch between adjacent filaments approximately equal to a pitch between adjacent rows of solder connections in the ball grid array.

4. A method according to claim 3, wherein each of the plurality of filaments has a common length extending from the fixture, the common length being greater than a distance between the first and second sides of the ball grid array.

5. A method according to claim 2, further comprising the steps of:
(d) simultaneously directing the plurality of filaments into respective spaces between successive pairs of rows of solder connections in a third side of the ball grid array, the third side of the ball grid array being between the first and second sides of the ball grid array;
(e) simultaneously inserting the plurality of filaments as far as possible into the ball grid array; and
(f) detecting a solder bridge if any of the plurality of filaments does not emerge from a fourth side of the ball grid array opposite the third side.

6. A method for inspecting an assembled printed circuit board having a device assembled to the printed circuit board by a ball grid array, the ball grid array having first and second sides separated by a distance, the ball grid array including a plurality of rows of solder connections, the method comprising the steps of:
(a) directing a filament into the first side of the ball grid array, between two adjacent rows of solder connections in the ball grid array;
(b) inserting the filament into the ball grid array by a distance greater than or equal to the distance between the first and second sides, if the filament is not blocked by an obstruction; and
(c) detecting a solder bridge if the filament is blocked by an obstruction.

7. A method according to claim 6, wherein:
step (a) includes simultaneously directing a plurality of filaments into respective spaces between successive pairs of rows of solder connections in a first side of the ball grid array;
step (b) includes simultaneously inserting the plurality of filaments into the ball grid array by a distance greater than or equal to the distance between the first and second sides, if none of the filament is blocked by an obstruction; and
step (c) includes detecting a solder bridge between the first and second sides if any of the filaments is blocked by an obstruction.

8. A method according to claim 7, further comprising, before step (a), the step of placing the plurality of filaments in a fixture, with a pitch between adjacent filaments approximately equal to a pitch between adjacent rows of solder connections in the ball grid array.

9. A method according to claim 8, wherein each of the plurality of filaments has a common length extending from the fixture, the common length being greater than a distance between the first and second sides of the ball grid array.

10. Apparatus for inspecting an assembled printed circuit board having a device assembled to the printed circuit board by a ball grid array, the ball grid array including a plurality of rows of solder connections, the apparatus comprising:
a plurality of filaments, each filament being longer than a side of the ball grid array, each filament having a diameter or thickness sufficiently small to fit between adjacent rows of solder connections in the ball grid array; and
a fixture for holding the plurality of filaments, with a pitch between adjacent filaments approximately equal to a pitch between adjacent rows of solder connections in the ball grid array.

11. Apparatus according to claim 10, wherein the filaments are formed of a polymer.

12. Apparatus according to claim 10, wherein the filaments are optical fibers.

13. Apparatus according to claim 10, wherein the filaments have a diameter of about 0.2 millimeters.

14. Apparatus according to claim 10, wherein the plurality of fibers includes a number of fibers that is one fewer than the number of rows of solder connections in the ball grid array.

* * * * *

UNITED STATES PATENT AND TRADEMARK OFFICE
CERTIFICATE OF CORRECTION

PATENT NO. : 5,955,683
DATED : September 21, 1999
INVENTOR(S) : Albert Holliday

It is certified that error appears in the above-identified patent and that said Letters Patent is hereby corrected as shown below:

On the title page,

Item [19] beneath UNITED STATES PATENT, please delete "Holiday" and insert therefor --Holliday--.

Item [75] Inventor, after "Albert", please delete "Holiday" and insert therefor --Holliday--.

Signed and Sealed this

Twenty-fifth Day of April, 2000

*Attest:*

Q. TODD DICKINSON

*Attesting Officer*  *Director of Patents and Trademarks*